(12) United States Patent
Murphy (10) Patent No.: US 9,361,770 B2
(45) Date of Patent: Jun. 7, 2016

(54) ELECTRICAL DEVICE CURRENT FLOW INDICATOR

(71) Applicant: Osborne Industries Inc., Osborne, KS (US)

(72) Inventor: Richard Burton Murphy, Osborne, KS (US)

(73) Assignee: Osborne Industries Inc., Osborne, KS (US)

( * ) Notice: Subject to any disclaimer, the term of this patent is extended or adjusted under 35 U.S.C. 154(b) by 381 days.

(21) Appl. No.: 13/858,871

(22) Filed: Apr. 8, 2013

(65) Prior Publication Data

US 2013/0265168 A1     Oct. 10, 2013

Related U.S. Application Data

(60) Provisional application No. 61/621,441, filed on Apr. 6, 2012.

(51) Int. Cl.
*G08B 5/36*     (2006.01)
*G01R 19/15*    (2006.01)

(52) U.S. Cl.
CPC . *G08B 5/36* (2013.01); *G01R 19/15* (2013.01)

(58) Field of Classification Search
CPC .................................. G08B 5/36; G01R 19/15
USPC ........................... 340/654, 655, 657; 439/490
See application file for complete search history.

(56) References Cited

U.S. PATENT DOCUMENTS

| 2,644,135 | A |   | 6/1953  | Schnoll |   |
|---|---|---|---|---|---|
| 3,258,693 | A |   | 6/1966  | Meyer |   |
| 3,863,150 | A |   | 1/1975  | Cebuliak et al. |   |
| 4,354,155 | A |   | 10/1982 | Speidel et al. |   |
| 4,417,205 | A |   | 11/1983 | Sabon et al. |   |
| 4,583,086 | A | * | 4/1986  | Andrews | G08B 21/185 340/640 |
| 5,015,944 | A | * | 5/1991  | Bubash | G01R 19/15 324/127 |
| 5,371,340 | A |   | 12/1994 | Stanfield |   |
| 5,434,389 | A |   | 7/1995  | Griebel |   |
| 5,451,747 | A | * | 9/1995  | Sullivan | A61F 7/007 219/505 |

(Continued)

OTHER PUBLICATIONS

Huntington Electric Company, Low Cost Remote Current Indicator, CR2550 Series, p. 85, CR Magnetics, Inc., 3500 Scarlet Oak Blvd., St. Louis, MO, USA, 63122, 2013.

(Continued)

*Primary Examiner* — Jennifer Mehmood
*Assistant Examiner* — Omar Casillashernandez
(74) *Attorney, Agent, or Firm* — Jeffrey L. Thompson; Thompson & Thompson, P.A.

(57) ABSTRACT

An electric current flow indicator senses electrical current flowing through an electrical device and produces a visible feedback to indicate proper operation. The current flow indicator has a voltage and current regulation circuit having first and second inputs connected to first and second conductors, respectively. The circuit converts an AC line voltage carried by an electrical supply cord into a limited low voltage DC current. A toroidal core inductor coil and at least one current indicating LED are connected to the circuit. The first conductor passes through a center of the inductor coil. A transistor amplifier is connected to an output of the inductor coil for energizing the current indicating LED when an electrical current conducts through the first conductor. The flow indicator can be integrated into an electrical supply cord, a male or female electrical cord end, a single or duplex electrical outlet, or a universal plugin adapter.

6 Claims, 6 Drawing Sheets

(56) References Cited

U.S. PATENT DOCUMENTS

| | | | | |
|---|---|---|---|---|
| 5,705,989 A * | 1/1998 | Cota | ............... | G01R 19/15 324/127 |
| 5,781,015 A * | 7/1998 | Duffin | ............... | G01R 31/045 324/133 |
| 5,920,191 A * | 7/1999 | Maniero | ............... | G01R 19/15 219/486 |
| 6,424,136 B1 | 7/2002 | Gardner | | |
| 7,154,405 B2 | 12/2006 | Oreman | | |
| 7,855,514 B2 | 12/2010 | Ku et al. | | |
| 8,558,710 B1 | 10/2013 | Nitz | | |
| 2005/0081070 A1 * | 4/2005 | Milan | ............... | H01R 31/02 713/300 |
| 2006/0232435 A1 * | 10/2006 | Sotiriou | ............... | G08B 5/36 340/815.4 |
| 2008/0293290 A1 | 11/2008 | Ku et al. | | |
| 2010/0317222 A1 | 12/2010 | Tom et al. | | |

OTHER PUBLICATIONS

Huntington Electric Company, Wire Mounted Current Indicator, CR45 Series & MB45 Bracket, p. 83, CR Magnetics, Inc., 3500 Scarlet Oak Blvd., St. Louis, MO, USA, 63122, 2013.

* cited by examiner

ELECTRICAL DEVICE CURRENT FLOW INDICATOR

BACKGROUND OF THE INVENTION

1. Field of the Invention

The present invention relates generally to electrical indicators, and in particular, to electrical indicators that provide a visual indication of operating load current.

2. Description of the Related Art

Electrical devices are used in many applications and can be either portable or permanently mounted. Each of these devices has a specific purpose and provides the user with differing means to identify proper operation. Some electrical devices produce audible noise which indicates that it is functioning and consuming electrical current from a given power source. These types of electrical devices include, but are not limited to, bells whistles, horns, sirens, and speakers. Other electrical devices provide visual feedback that indicates that electrical current from a given power source is being consumed. Some of these electrical devices can include, but are not limited to, fans, lights, material agitators, or driven mechanical systems such as belts and gears. There are also electrical devices that provide vibratory feedback when consuming electrical current from a power source. Examples of electrical devices that create vibrations can include, but are not limited to, motors, pumps, reciprocating machines, and sanders. Many of these electrical devices create all or some of these feedback modes. However, there are some electrical devices that do not create any of these feedback modes to the user. Likewise, an electrical device may be located in such a way that the user cannot sense the feedback of the device. Since no audible, visible, or vibratory feedback mode is generated, proper operation of the device will be difficult to identify.

A type of electrical device that generally does not create any audible, visible, or vibratory feedback to the user is electrical heating circuits. Electrical heating circuits consume electrical current when electricity flows through wires or elements that have a specific resistance to electrical current flow. This resistance generates heat within the wire which can be felt, but in some cases not directly seen or heard. Proper operation of this quiet, invisible, and non-moving electrical device is difficult to identify without touching. Touching such an electrical device can be dangerous owing to potential electrical shock or flesh burns from high temperatures. Some of these applications can include, but are not limited to, vehicle engine heaters, pipe and roof gutter heat tapes, and electrical heating pads for animals.

Occasionally, these heating circuits and other electrical devices are mounted in locations where it is difficult or impossible to obtain any type of proper operation feedback by the user. Examples of this situation could be, but are not limited to, devices that are installed a distance from the user or if the device is installed in confined and insulated space.

Therefore, in cases where heating circuits or electrical devices cannot be readily identified as operating properly, an electrical current flow indicator is needed.

SUMMARY OF THE INVENTION

An object of the present invention is to provide a current flow indicator for identifying proper operation of electrical equipment or components that provide no audible, visible, or vibratory indication of operation. This electric current flow indicator can be molded onto the electric supply cord of a specific electrical device or molded into a universal plug adapter. The universal plug adapter provides a means for connecting between an electrical device and an electrical supply source to provide a visible indication of operation.

The current flow indicator of the present invention will sense electrical current flowing through the electrical device and will produce a visible feedback mode to indicate proper operation. Some electrical devices have a light or light emitting diode (LED) that indicates an electrical supply source is connected. This indication light only informs the user that an electrical supply source is available and not that the actual electrical device is operating and consuming electrical current. However, the present invention will indicate both: connection to an electrical supply source and any consumption of electrical current which indicates operation. The present invention is designed for a single electrical device owing to the requirement that the electrical current must be consumed (operating mode) or not consumed (off mode or non-operating). If multiple electrical devices are connected to the invention, electrical current may be consumed by one or more of the other devices and activate the invention.

BRIEF DESCRIPTION OF THE DRAWINGS

The present invention will become more clearly appreciated as the disclosure of the present invention is made with reference to the accompanying drawings. In the drawings.

DETAILED DESCRIPTION OF THE INVENTION

A current flow indicator device 10 for an electrical device according to the present invention will now be described with reference to FIGS. 1 to 13 of the accompanying drawings.

The current flow indicator device 10 of the present invention includes a circuit board 11 that can be mounted in a connection block molded onto an electrical supply cord (FIGS. 1 to 8), or in a stand-alone wall plug assembly (FIGS. 9 to 12). The circuit board 11 contains a power limited rectifier 12, a supply voltage indicator LED 13, and a current indicator LED 14 connected to an amplified signal from a toroidal core inductor coil 15. The device 10 is connected to line 1 and neutral conductors 16, 17 (120 V ac circuit) or line 1 and line 2 conductors (208 or 240 V ac circuit). The line 1 conductor 16 is routed in the device 10 with a single pass 18 through the center opening 19 in the toroidal core inductor coil 15.

In the embodiment illustrated in FIGS. 1 to 8, the circuit board 11 of the device 10 is molded into a plug-in module 20 that snaps into a connection block 21 molded onto the electrical supply cord 22 to protect the electrical circuit board 11 and provide the user with protection from electrical shock. This final assembly will be water-tight and durable for handling in rough service duty applications. The plug-in module 20 allows the current flow indicator device 10 to be replaced in the field, if it should fail, instead of requiring replacement of the complete apparatus to which it is attached.

In the embodiment illustrated in FIGS. 9 to 12, the circuit board 11 of the device 10 is mounted in a stand-alone, universal plug-in adapter assembly 30. The plug-in adapter assembly 30 has a conventional three-prong male coupling 31 for plugging into an electrical outlet, such as a wall outlet. The plug-in adapter assembly 30 has a conventional female receptacle 32 for receiving a male coupling of an electrical supply cord for an electrical device. The electricity consumed by the electrical device flows from the electrical outlet through the plug-in adapter assembly 30 to the electrical device. Other embodiments are also contemplated by the present invention, such as integrating the device 10 into a male electrical cord end, a female electrical cord end, a single or duplex electrical outlet, or an electrical apparatus control panel.

The current flow indicator device 10 works by connecting an electrical supply source to the electrical supply cord 22 to the terminals 23 mounted on the circuit board 11. The electrical output cord 22 that powers the attached electrical device (not shown) is also connected to the terminals 23 mounted on the circuit board 11. The line 1 or black wire 16 of the electrical supply cord 22 is passed through the center opening 19 of the toroidal core inductor coil 15. The circuit board input terminals 23 are connected to a voltage and current reducing circuit 24 that powers one or more LED(s) 13 to indicate that the device 10 is connected to an electrical supply source. The toroidal core inductor coil 15 is connected to a transistor amplifier 29 (FIG. 13), which switches to an ON state when an electrical current conducts through the line one conductor 16. When the transistor amplifier 29 switches to an ON state, it powers one or more LED(s) 14 that indicate electrical current is being consumed.

The current flow indicator device 10 indicates electrical current consumption by allowing the electrical current being consumed by the electrical device to flow through the line 1 conductor 16 which passes through the center opening 19 of the toroidal core inductor coil 15. The electrical current that flows around the toroidal core inductor coil 15 induces an isolated current to be developed in the toroidal core inductor coil 15 that powers the output LED(s) 14 through the transistor amplifier 29. The inductor coil 15 functions as an electrical transformer to create an isolated current for powering the output LED(s) 14 when a current flows through the line 1 conductor 16. This design is valuable as it isolates the electrical current indicating circuit from the electrical circuit connecting the electrical device. If any damage to the electrical device occurs, the electrical current indicating circuit will be unharmed. Likewise, a failure of the indicator device 10 will not affect the operation or use of the connected electrical device.

The electrical circuit to indicate an electrical supply source voltage is connected to the voltage and power limited rectifier circuit 12. This circuit provides a limited low voltage DC current to the indicating components of the device. This provides a constant current for the source voltage indicating LED(s) 13, which is constant regardless of the alternating current (AC) voltage connected to the electrical supply source. This has three functions: 1) to provide a constant brightness of the voltage indicating LED(s) 13; 2) to limit the voltage and current to the LED(s) 13 to improve the life and reliability of the circuit; and 3) to provide a reverse voltage protection to the LED(s) 13 and the transistor 28.

Figure 1:
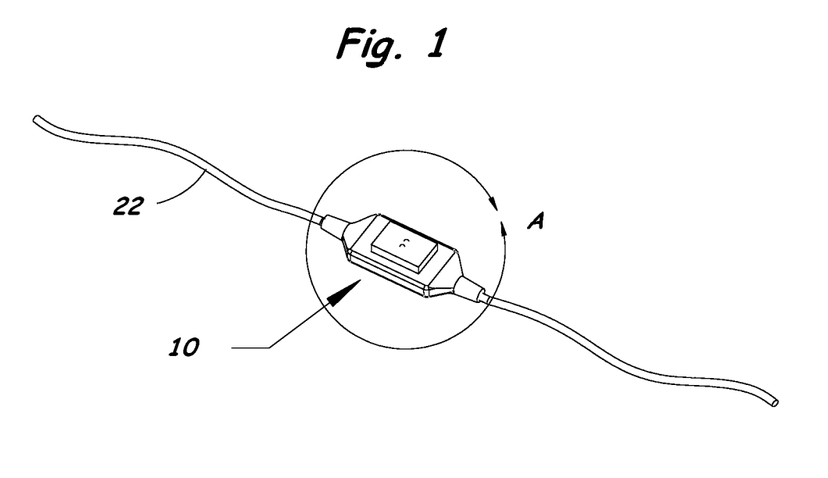
FIG. 1 is a perspective front view of an electrical supply cord having a current flow indicator according to the present invention.
Figure 2:
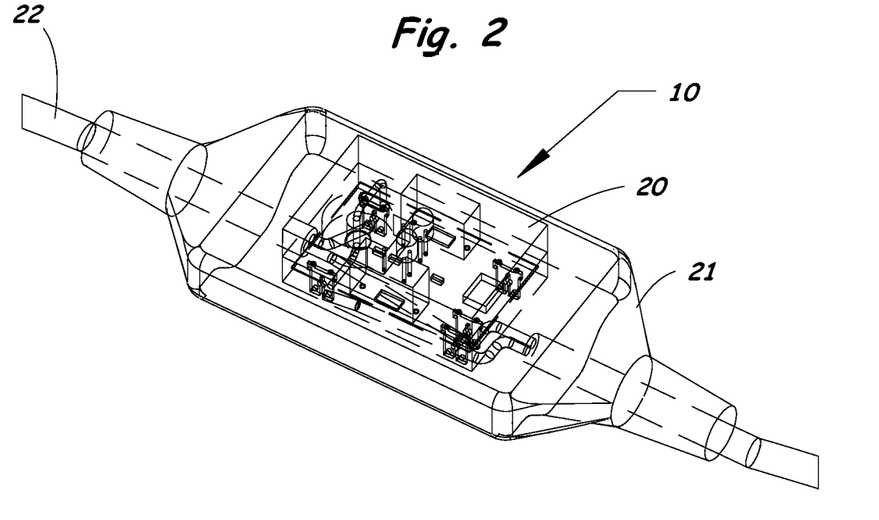
FIG. 2 is a detail perspective view of the area A shown in FIG. 1.
Figures 3, 4:
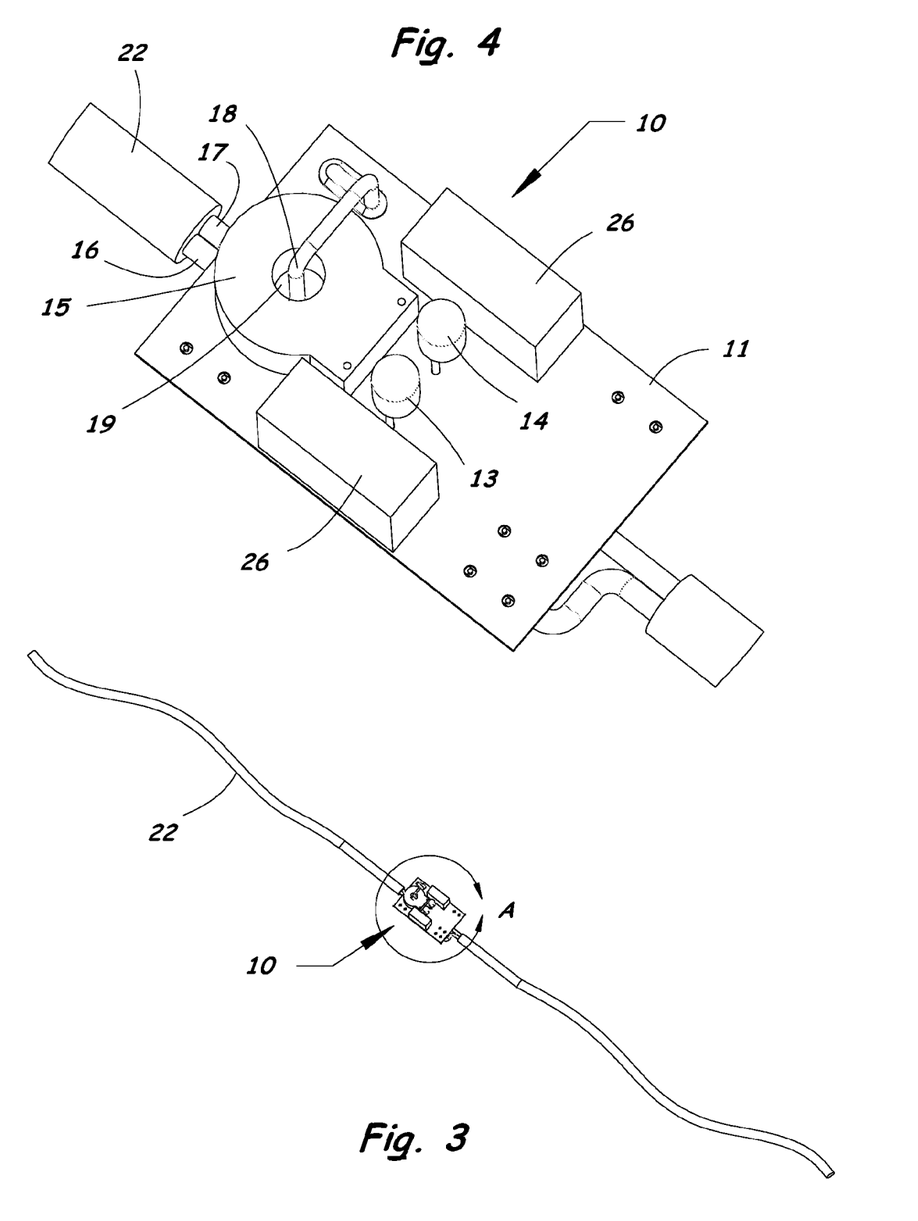
FIG. 3 is a perspective front view of the electrical supply cord with the current flow indicator shown with its housing removed.
FIG. 4 is a detail perspective view of the area A shown in FIG. 3.
Figure 5:
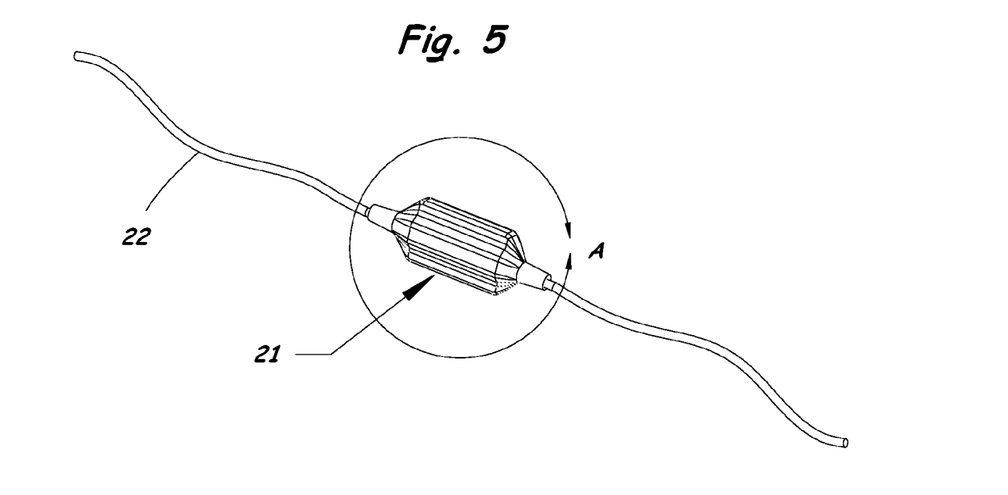
FIG. 5 is a perspective rear view of the electrical supply cord with the current flow indicator.
Figure 6:
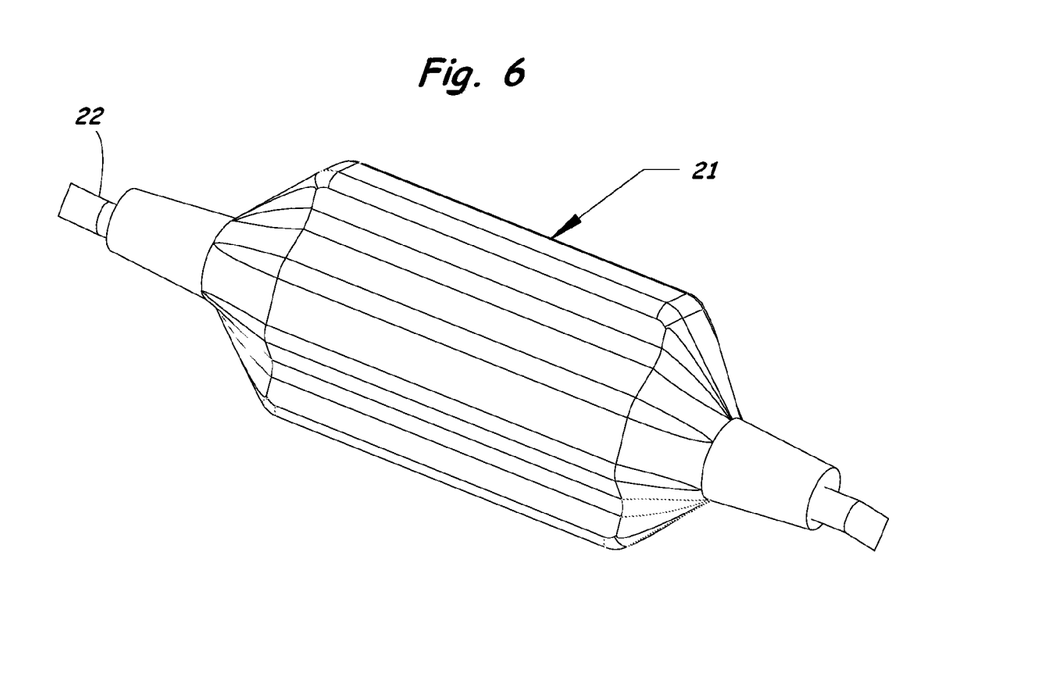
FIG. 6 is a detail perspective view of the area A shown in FIG. 5.
Figure 7:
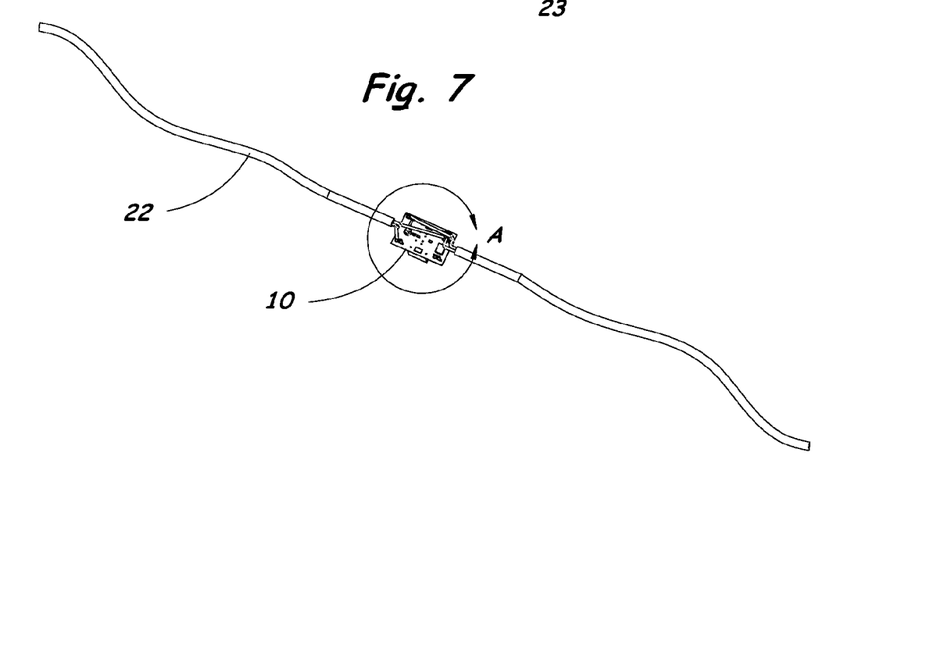
FIG. 7 is a perspective rear view of the electrical supply cord with the current flow indicator shown with its housing removed.
Figure 8:
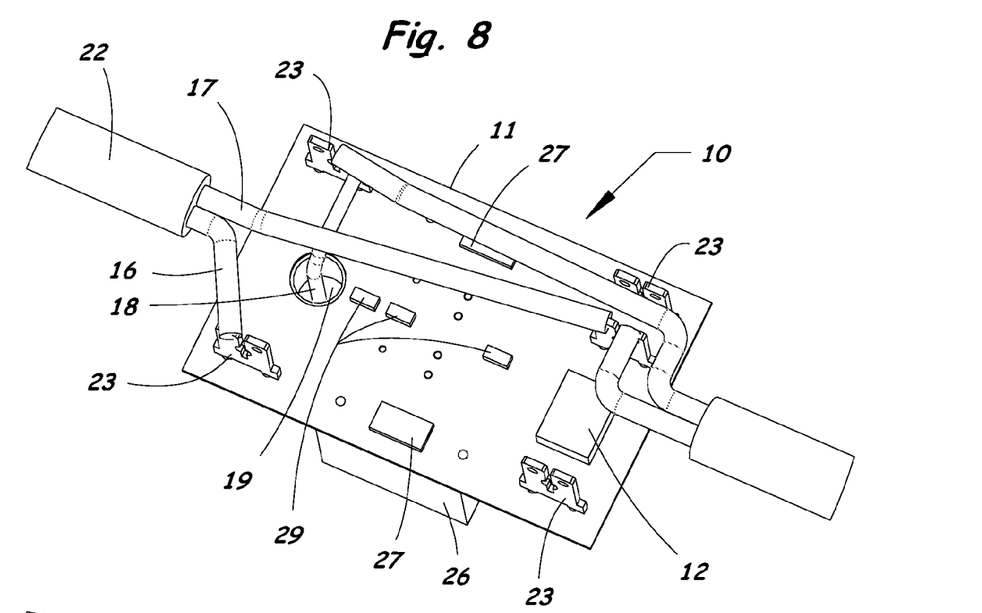
FIG. 8 is a detail perspective view of the area A shown in FIG. 7.
Figure 9:
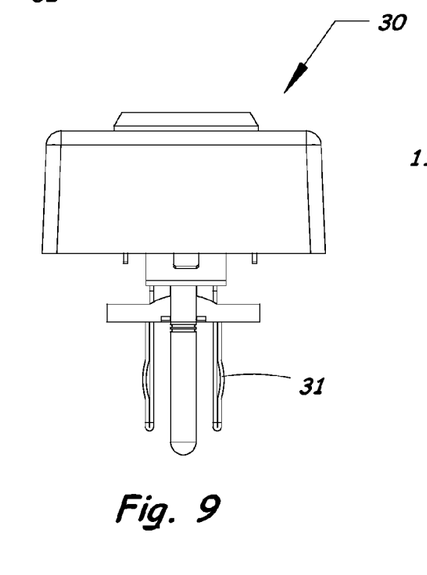
FIG. 9 is a bottom view of a universal plugin adapter having a current flow indicator according to the present invention.
Figure 10:
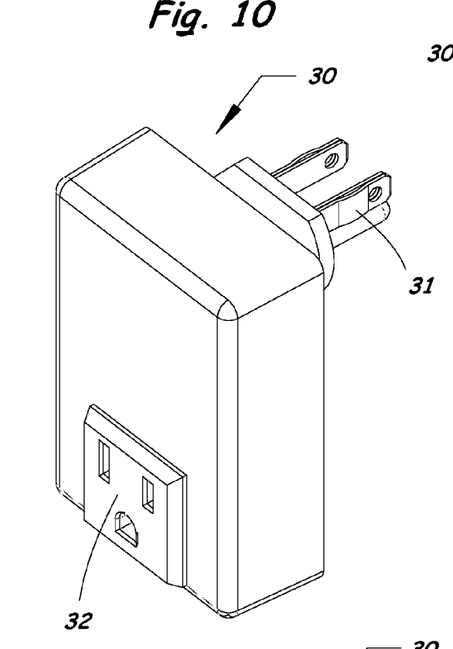
FIG. 10 is a perspective rear view of the universal plugin adapter shown in FIG. 9.
Figure 11:
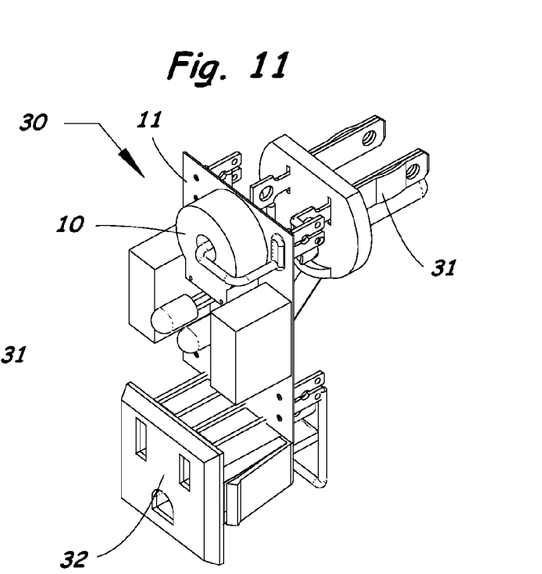
FIG. 11 is a perspective rear view of the universal plugin adapter shown in FIG. 9 with its housing removed.
Figure 12:
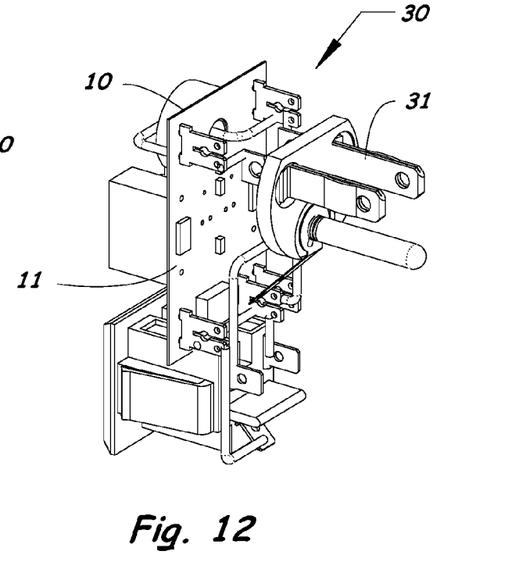
FIG. 12 is a perspective front view of the universal plugin adapter shown in FIG. 9 with its housing removed.
Figure 13:
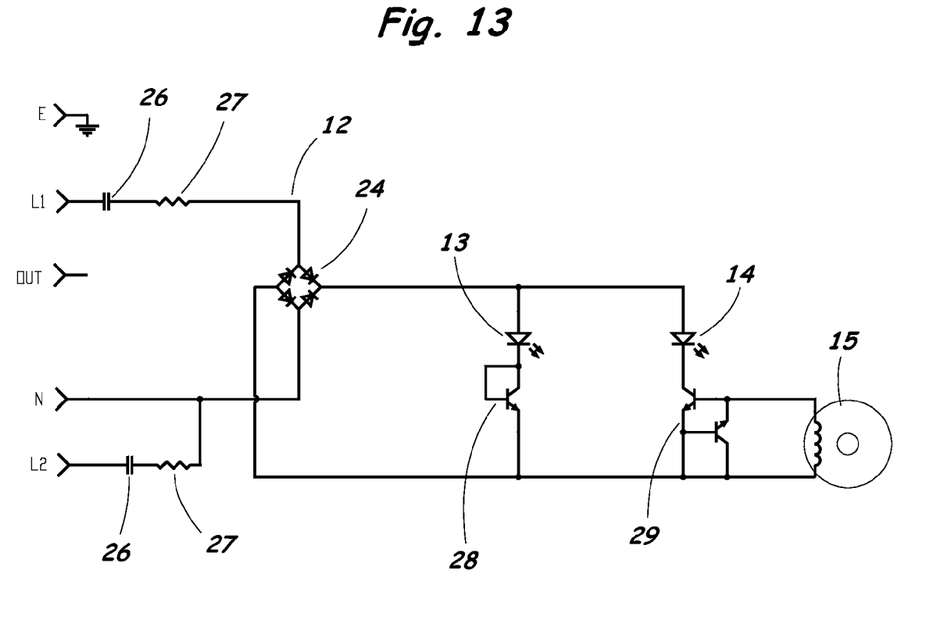
FIG. 13 is a schematic diagram that illustrates the electrical circuit used in the current flow indicator of the present invention.

FIG. 13 illustrates the electrical circuit used in the present invention. The electrical circuit includes a voltage and power limited rectifier 12 having one or more high voltage film capacitor(s) 26, one or more current limiting resistor(s) 27, a bridge rectifier 24 supplying a limited low voltage DC current to an LED 13 and transistor 28 to indicate the presence of line voltage. The circuit also includes an inductive current sensing circuit comprised of the toroidal core inductor coil 15 through which a single AC current carrying conductor 16 of the electrical supply line is passed. The inductor coil 15 is connected to a transistor amplifier 29 to switch on an LED 14 when the AC current through the conductor 16 of the electrical supply line is sufficient to induce a current into the toroidal core inductor coil 15. The device 10 provides a visual indication by lighting the LED(s) 13, 14 with consistent brightness independent of the AC input voltage and the AC load current above minimum voltage and current activation levels. The device can be integrated into an electrical supply cord (FIGS. 1 to 8), a male electrical cord end, a female electrical cord end, a single or duplex electrical outlet, a universal plug-in adapter assembly (FIGS. 9 to 13), or an electrical apparatus control panel.

While the invention has been specifically described in connection with specific embodiments thereof, it is to be understood that this is by way of illustration and not of limitation, and the scope of the appended claims should be construed as broadly as the prior art will permit.

What is claimed is:

1. An electric current flow indicator for use with an electrical supply cord having first and second electrical conductors comprising:
   a voltage and current regulation circuit having first and second inputs connected to said first and second conductors, respectively, said voltage and current regulation circuit comprising at least one film capacitor, at least one resistor, and a bridge rectifier that converts an AC line voltage carried by said electrical supply cord into a limited voltage DC current;
   at least one current indicating LED connected to said voltage and current regulation circuit to receive limited voltage DC current from said bridge rectifier;
   a toroidal core inductor coil connected to said voltage and current regulation circuit, said first conductor passing through a center of said inductor coil; and
   a transistor amplifier arranged to energize said current indicating LED when an electrical current conducts through said first conductor;
   wherein said transistor amplifier is connected to an output of said inductor coil, said transistor amplifier having an ON state that allows current to pass through said current indicating LED, said transistor amplifier being switched to its ON state when an electrical current conducts through said first conductor and causes a current to flow from said inductor coil to said transistor amplifier;

wherein said voltage and current regulation circuit maintains a constant limited voltage DC current to said current indicating LED when electrical current is conducting through said first conductor, even as the amount of electrical current or voltage in the first conductor changes; and a transistor and voltage indicating LED connected to the voltage and current regulation circuit to receive limited voltage DC current from said bridge rectifier to energize said voltage indicating LED when an electrical voltage is present in said electrical supply cord.

2. A livestock heating pad, comprising:

an electrical heating circuit that consumes electrical current when electricity flows through elements that have a resistance to electrical current flow;

an electrical supply cord having first and second electrical conductors for supplying electrical current to said heating circuit; and an electric current flow indicator comprising:

a voltage and current regulation circuit having first and second inputs connected to said first and second conductors, respectively, said voltage and current regulation circuit comprising at least one film capacitor, at least one resistor, and a bridge rectifier that converts an AC line voltage carried by said electrical supply cord into a limited voltage DC current;

at least one current indicating LED connected to said voltage and current regulation circuit to receive limited voltage DC current from said bridge rectifier;

a toroidal core inductor coil connected to said voltage and current regulation circuit, said first conductor passing through a center of said inductor coil; and a transistor amplifier arranged to energize said current indicating LED when an electrical current conducts through said first conductor;

wherein said transistor amplifier is connected to an output of said inductor coil, said transistor amplifier having an ON state that allows current to pass through said current indicating LED, said transistor amplifier being switched to its ON state when an electrical current conducts through said first conductor and causes a current to flow from said inductor coil to said transistor amplifier;

wherein said voltage and current regulation circuit maintains a constant DC current to said current indicating LED when electrical current is conducting through said first conductor, even as the amount of electrical current or voltage in the first conductor changes; and a transistor and voltage indicating LED connected to the voltage and current regulation circuit to receive limited voltage DC current from said bridge rectifier to energize said voltage indicating LED when an electrical voltage is present in said electrical supply cord.

3. An electrical plugin adapter, comprising:

a male coupler for plugging into an electrical receptacle;

a female coupler for receiving a male end of an electrical supply cord;

first and second electrical conductors connected between said male and female couplers for supplying electrical current through said adapter; and an electric current flow indicator comprising:

a voltage and current regulation circuit having first and second inputs connected to said first and second conductors, respectively, said voltage and current regulation circuit comprising at least one film capacitor, at least one resistor, and a bridge rectifier that converts an AC line voltage carried by said electrical supply cord into a limited voltage DC current;

at least one current indicating LED connected to said voltage and current regulation circuit to receive limited voltage DC current from said bridge rectifier;

a toroidal core inductor coil connected to said voltage and current regulation circuit, said first conductor passing through a center of said inductor coil; and a transistor amplifier arranged to energize said current indicating LED when an electrical current conducts through said first conductor;

wherein said transistor amplifier is connected to an output of said inductor coil, said transistor amplifier having an ON state that allows current to pass through said current indicating LED, said transistor amplifier being switched to its ON state when an electrical current conducts through said first conductor and causes a current to flow from said inductor coil to said transistor amplifier;

wherein said voltage and current regulation circuit maintains a constant DC current to said current indicating LED when electrical current is conducting through said first conductor, even as the amount of electrical current or voltage in the first conductor changes; and a transistor and voltage indicating LED connected to the voltage and current regulation circuit to receive limited voltage DC current from said bridge rectifier to energize said voltage indicating LED when an electrical voltage is present in said electrical supply cord.

4. A combination of an electrical device and a current flow indicator, comprising:

an electrical device that consumes a current without creating any audible, visible, or vibratory feedback to the user during operation, said electrical device having an electrical supply cord with first and second electrical conductors for supplying electrical current to said electrical device; and an electric current flow indicator comprising:

a voltage and current regulation circuit having first and second inputs connected to said first and second conductors, respectively, said voltage and current regulation circuit comprising at least one film capacitor, at least one resistor, and a bridge rectifier that converts an AC line voltage carried by said electrical supply cord into a limited voltage DC current;

at least one current indicating LED connected to said voltage and current regulation circuit to receive limited voltage DC current from said bridge rectifier;

a toroidal core inductor coil connected to said voltage and current regulation circuit, said first conductor passing through a center of said inductor coil; and a transistor amplifier arranged to energize said current indicating LED when an electrical current conducts through said first conductor;

wherein said transistor amplifier is connected to an output of said inductor coil, said transistor amplifier having an ON state that allows current to pass through said current indicating LED, said transistor amplifier being switched to its ON state when an electrical current conducts through said first conductor and causes a current to flow from said inductor coil to said transistor amplifier;

wherein said voltage and current regulation circuit maintains a constant DC current to said current indicating LED when electrical current is conducting through said first conductor, even as the amount of electrical current or voltage in the first conductor changes; and a transistor and voltage indicating LED connected to the voltage and current regulation circuit to receive limited voltage DC current from said bridge rectifier to energize said voltage indicating LED when an electrical voltage is present in said electrical supply cord.

5. An AC operation indicating device which indicates both AC input voltage supplied to a load and an operating AC load current, comprising: a voltage and current limited rectifier having one or multiple film capacitor(s), one or multiple resistor(s), and a bridge rectifier supplying a limited voltage DC current to a transistor and first LED to indicate input voltage and to an inductive current sensing circuit having a second LED to indicate current, said inductive current sensing circuit comprising a toroidal core inductor coil through which a single AC current carrying conductor is passed, said toroidal core inductor coil being connected to a transistor amplifier to switch on said second LED when AC load current in said AC current carrying conductor is sufficient to induce a current into the toroidal core inductor coil, and said first and second LEDs are lit with consistent brightness independent of the AC input voltage and the AC load current above minimum voltage and current activation levels;

wherein said transistor amplifier is connected to an output of said inductor coil, said transistor amplifier having an ON state that allows current to pass through said second LED, said transistor amplifier being switched to its ON state when an electrical current conducts through said AC current carrying conductor and causes a current to flow from said inductor coil to said transistor amplifier;

wherein said voltage and current limited rectifier maintains a constant limited voltage DC current to said second LED when an operating AC load current is conducting through said AC current carrying conductor, even as the amount of electrical current or voltage in the AC current carrying conductor changes; and wherein said transistor and said first LED are connected to the voltage and current limited rectifier to receive limited voltage DC current from said bridge rectifier to energize said first LED when an AC input voltage is present in said AC current carrying conductor.

6. The device according to claim 5, integrated into an electrical supply cord, a male electrical cord end, a female electrical cord end, a single or duplex electrical outlet, or into a universal plugin adapter.

* * * * *